(12) United States Patent
Merkel

(10) Patent No.: US 10,266,150 B2
(45) Date of Patent: Apr. 23, 2019

(54) METHOD FOR DETERMINING AN ACCESS AUTHORIZATION TO A TRANSPORTATION VEHICLE AND AUTHORIZATION SYSTEM FOR A TRANSPORTATION VEHICLE

(71) Applicant: VOLKSWAGEN AG, Wolfsburg (DE)

(72) Inventor: Rolf Merkel, Ingolstadt (DE)

(73) Assignee: Volkswagen AG (DE)

( * ) Notice: Subject to any disclaimer, the term of this patent is extended or adjusted under 35 U.S.C. 154(b) by 0 days.

(21) Appl. No.: 16/029,553

(22) Filed: Jul. 7, 2018

(65) Prior Publication Data

US 2019/0016301 A1   Jan. 17, 2019

(30) Foreign Application Priority Data

Jul. 12, 2017   (DE) .................. 10 2017 211 941

(51) Int. Cl.
*B60R 25/24* (2013.01)
*G06K 9/00* (2006.01)
*B60R 16/037* (2006.01)
*H03L 7/08* (2006.01)

(52) U.S. Cl.
CPC ............ *B60R 25/24* (2013.01); *B60R 16/037* (2013.01); *G06K 9/00302* (2013.01); *H03L 7/08* (2013.01)

(58) Field of Classification Search
CPC ......... B60R 25/24; B60R 16/037; H03L 7/08; G06K 9/00302; H04W 4/21; H04W 4/029
USPC ........................................................ 340/5.61
See application file for complete search history.

(56) References Cited

U.S. PATENT DOCUMENTS 10,059,342 B2 *  8/2018  Ricci ................. H04W 4/21
10,124,765 B2 * 11/2018  Wilt .................. H04W 4/029

FOREIGN PATENT DOCUMENTS

| DE | 19802526 A1 | 7/1999 |
| DE | 10004213 A1 | 8/2001 |
| DE | 10013913 A1 | 10/2001 |
| DE | 10019277 A1 | 11/2001 |

(Continued)

OTHER PUBLICATIONS

Search Report for German Patent Application No. 10 2017 211 941.1; dated Dec. 21, 2017.

*Primary Examiner* — Ali Neyzari
(74) *Attorney, Agent, or Firm* — Barnes & Thornburg LLP

(57) ABSTRACT

A method for determining an access authorization to a transportation vehicle, wherein an internal authorization device emits a request signal into an environment of the transportation vehicle depending on a predefined triggering event. The authorization device checks the response signal received for at least one request condition. Based on the at least one request condition, access to the transportation vehicle is granted. Concurrently, the transportation vehicle-internal authorization device forwards the request signal to a transportation vehicle-internal key processing unit which calculates a comparison response signal and forwards the signal to the authorization device. The authorization device determines a time difference between a time of receipt of the response signal from the environment of the transportation vehicle and a time of receipt of the comparison response signal. The at least one request condition is satisfied in response to the calculated time difference being below a predetermined threshold value.

14 Claims, 2 Drawing Sheets

(56) References Cited

FOREIGN PATENT DOCUMENTS

| DE | 10212648 A1 | 10/2003 |
|---|---|---|
| DE | 102005062455 A1 | 7/2007 |
| DE | 102014111890 A1 | 3/2015 |
| DE | 102015206009 A1 | 10/2016 |
| EP | 0992408 A2 | 4/2000 |

* cited by examiner

METHOD FOR DETERMINING AN ACCESS AUTHORIZATION TO A TRANSPORTATION VEHICLE AND AUTHORIZATION SYSTEM FOR A TRANSPORTATION VEHICLE

PRIORITY CLAIM

This patent application claims priority to German Patent Application No. 10 2017 211 941.1, filed 12 Jul. 2017, the disclosure of which is incorporated herein by reference in its entirety.

SUMMARY

Illustrative embodiments relate to a method for determining an access authorization to a transportation vehicle. Illustrative embodiments also relate to an authorization device which determines a time difference between a time of receipt of a response signal and a time of receipt of a comparison response signal

BRIEF DESCRIPTION OF THE DRAWINGS

An exemplary embodiment is described in the following drawings, in which.

DETAILED DESCRIPTION

Figure 1:
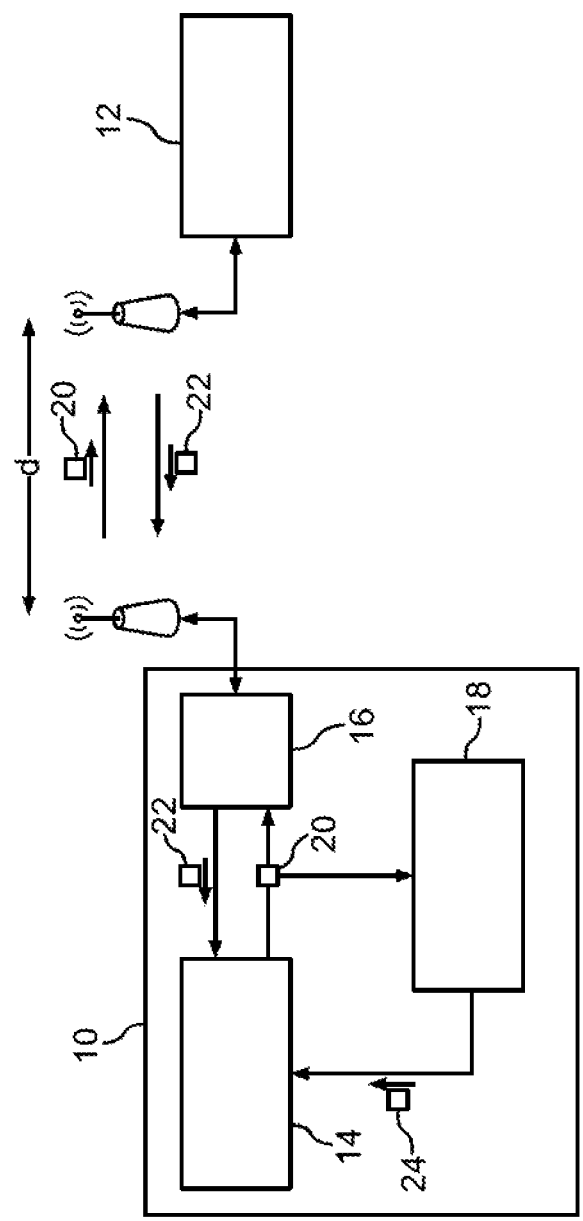
FIG. 1 shows a schematic representation of an authorization system for a transportation vehicle and a wireless key.

An authorization system for a transportation vehicle, which communicates with a wireless key for locking and unlocking the transportation vehicle, is generally known from the prior art. So-called keyless-entry or keyless-go systems are also known, in which a wireless communication link to the wireless key is established with a limited range by a transportation vehicle-internal authorization device of the transportation vehicle. This comes into effect when a transportation vehicle user attempts to gain access to this transportation vehicle, for example, via approaching the transportation vehicle and/or making contact with the transportation vehicle, such as by touching a transportation vehicle door. The transportation vehicle-internal authorization device then emits a request signal, also known as a "challenge". In response to the request signal, the wireless key then sends a response signal with access data to the authorization device via the communication link, also known as a "response". The authorization device decides, depending on the received response signal, if authorization may be granted to unlock the transportation vehicle and/or to start the engine of the transportation vehicle. If the access data in the response signal do not match the requested access data, no access authorization to the transportation vehicle is granted, so that the transportation vehicle remains locked.

In the course of a so-called relay attack, however, it is possible to extend the limited range of the communication link. Thus, unauthorized persons can gain access to the transportation vehicle and possibly unlock the transportation vehicle and start an engine of the transportation vehicle.

In this connection, EP 0 992 408 B1 describes a method for establishing an access authorization to a transportation vehicle. The transportation vehicle has at least two transmission units, which determine a signal propagation time of the signals transmitted between the transmission units and an electronic key. From this signal propagation time a distance between the transmission units and the electronic key is determined.

DE 100 04 213 A1 discloses a method for controlling a movement of an electric motor-driven moving part of a transportation vehicle. When a remote control unit is activated, an activation signal is sent from the remote control unit to the transportation vehicle and then a transportation vehicle signal is sent from the transportation vehicle to the remote control unit. This unit then sends a key signal to the transportation vehicle. The transportation vehicle determines a signal propagation time between the emission of the transportation vehicle signal and the time at which the key signal is received.

In DE 10 2005 062 455 A1 an authentication system for the use of a transportation vehicle is disclosed. Using at least three receiver antennas arranged on the transportation vehicle, a propagation time difference for receiving a signal from a transmitter can be determined, so that a relative position of the transmitter with respect to the transportation vehicle can be determined.

DE 100 19 277 A1 describes a securing method for securing an object against unauthorized usage, in which a signal propagation time which elapses between a query unit and a response unit is applied as a criterion for granting key-less access to the object. The query unit generates a query signal from which an authorization code is determined, which is expected by the response unit in response to the query signal.

DE 10 2014 111 890 A1 describes a distance measurement system for measuring a distance between an interrogator and a transponder. In this system, the transponder has a memory in which a response signal generated in response to an excitation signal is buffered. The interrogator waits for a predetermined period of time after transmission of the excitation signal, whereupon it emits a distance measurement signal. Upon receipt of the distance measurement signal, the buffered response signal is dispatched by the transponder.

These techniques described have the common goal of calculating a distance from the key to the transportation vehicle by the determined signal propagation time, so that access to the transportation vehicle is granted only if the calculated distance falls below a maximum allowable distance. However, the known methods for determining the signal propagation time require a complex design involving, for example, the attachment of a plurality of receiver antennas to the transportation vehicle, or a special programming or conversion of the key. Nevertheless, these methods are unsuitable for transportation vehicles which are already equipped with the so-called keyless entry or Keyless-Go system, since a conversion of the transportation vehicle or even a complete replacement of the key system is then necessary. Furthermore, a precise determination of the distance between the transportation vehicle and the key cannot be guaranteed using the above methods.

Disclosed embodiments create a method for determining an access authorization to a transportation vehicle, by which the transportation vehicle is operated as securely as possible in a reliable manner and with good anti-theft protection.

The disclosed method for determining an access authorization to a transportation vehicle provides that a transportation vehicle-internal authorization device generates a request signal depending on a predefined trigger event. In other words, the transportation vehicle-internal authorization device detects the predefined trigger event, for example, as a trigger pulse. For example, such a trigger event is given by detection of a person approaching the transportation vehicle, by operating a button and/or a door handle and/or by detection of a foot movement in the vicinity of a luggage compartment of the transportation vehicle. The request signal generated by the transportation vehicle-internal authorization device is then forwarded to a transmit and receive device of the transportation vehicle, which emits the request signal into an environment of the transportation vehicle. The transmit and receive device can comprise a transmitter, a receiver, a modulator and/or a demodulator. In other words, the transmit and receive device is also designed to receive a signal from the environment of the transportation vehicle.

If after transmission of the response signal by the transmit and receive device a response signal is received from the environment of the transportation vehicle, in particular, a response signal of a wireless key, the received response signal is forwarded to the transportation vehicle-internal authorization device. The transportation vehicle-internal authorization device then checks the received response signal for at least one request condition, and depending on the satisfaction of the at least one request condition, grants access to the transportation vehicle. The at least one request condition can comprise, for example, the fact that a key and/or code transmitted by the response signal corresponds to a key and/or code required by the transportation vehicle-internal authorization device.

The transportation vehicle-internal authorization device also forwards the request signal to a transportation vehicle-internal key processing unit. This forwarding is performed simultaneously with and/or within a short time of the forwarding of the request signal to the transmit and receive device of the transportation vehicle. In other words, the same request signal generated by the transportation vehicle-internal key processing unit is, on the one hand, emitted by the transmit and receive device into an environment of the transportation vehicle and, on the other hand, forwarded to the transportation vehicle-internal key processing unit. After receipt of the request signal the transportation vehicle-internal key processing unit calculates a comparison response. The comparison response can correspond to a response which is expected by the transportation vehicle-internal authorization device in response to the request signal, to grant the access to the transportation vehicle. In other words, the comparison response can correspond to a possible response of a wireless key. The comparison response can also be purely a simulation of the possible expected response of the wireless key, however. The transportation vehicle-internal key processing unit can in this case simulate the possible expected response of the wireless key.

After calculating the comparison response, the transportation vehicle-internal key processing unit generates a comparison response signal with the comparison response and forwards the comparison response signal to the transportation vehicle-internal authorization device. The transportation vehicle-internal authorization device then determines a time difference between a time of receipt of the response signal received by the transmit and receive device and a time of receipt of the comparison response signal forwarded by the transportation vehicle-internal key processing unit. For example, the transportation vehicle-internal authorization device detects the respective times of receipt of the response signal and the comparison response signal independently of each other. If the two respective times have then been detected, the transportation vehicle-internal authorization device can determine the time difference from these. In other words, the time difference corresponds to a temporal interval between the receipt of the comparison response signal and the receipt of the response signal, for example, from a wireless key. If no response signal from a wireless key is received, the determination of the time difference fails and the access authorization is denied.

The at least one request condition is then satisfied if the calculated time difference is below a predefined threshold value. In other words, the transportation vehicle-internal authorization device only grants access to the transportation vehicle if the calculated time difference falls below the predefined threshold value. At the same time, the predefined threshold value can be defined depending on the type of the requested access authorization. If, for example, only unlocking of the transportation vehicle is requested, the predefined threshold value can correspond to the time which is equivalent to a distance between the transportation vehicle and the wireless key of, for example, 5 meters. If, however, a request is made to start the transportation vehicle, the predefined threshold value can be lower than in the previous case, i.e., it can correspond to the time which is equivalent to a distance between the transportation vehicle and the wireless key of 1.5 meters.

The disclosed method provides that the comparison response signal and the response signal of the wireless key are each assembled from a plurality of data points. Such a composition may be obtained, for example, from a plurality of data bits. Each data point of the comparison response signal is categorized as predictable or as unpredictable. In other words, if the data point that was calculated by the transportation vehicle-internal key processing unit is predictable, this data point is indexed as such. This indexing and/or categorization can be included in the comparison response signal. A data point is categorized as predictable if, for example, the data point can be calculated uniquely. In other words, for example, no random numbers are used for calculating the respective data point, so that every re-calculation leads to the same result and therefore to the same data point. The transportation vehicle-internal authorization device compares a particular data point of the comparison response signal with a data point of the response signal of the wireless key only if the respective data point of the comparison response signal was categorized as predictable. This ensures that two data points can only be compared with each other if this comparison can also lead to a plausible result. If for each predictable data point of the comparison response signal a corresponding data point exists in the response signal of the wireless key, then the at least one request condition can be satisfied, which confirms that the response signal of the wireless key is a correct response signal, which authorizes the granting of access to the transportation vehicle. Thus, in this disclosed embodiment it is simultaneously checked whether the response signal of the wireless key has the required access data to the transportation vehicle, and additionally whether the condition is satisfied that the wireless key be located within a predetermined distance of the transportation vehicle.

The transportation vehicle-internal authorization device determines the time difference by a plurality of time measuring devices in a continuous manner. The term 'continuously' means that the time difference is determined at multiple instants at a predefined temporal interval with respect to each other. For this purpose, in each case a time measuring device starts a time counter when a data item on the comparison response signal which is categorized as predictable is received by the transportation vehicle-internal authorization device. This time measurement device stops the time counter when a corresponding data point of the response signal is received by the transportation vehicle-internal authorization device and the result of a comparison of the data point from the comparison response signal that is categorized as predictable with the corresponding data point of the response signal shows that the two data points agree with each other. For each data point that was to be calculated by the processing unit of the wireless key, it is therefore possible to determine the distance from the transportation vehicle at which the wireless key was located at the time of the generation and/or transmission of the data point. Thus, the distance between the transportation vehicle and the wireless key is not determined only once, but multiple times and/or continuously over a predefined period of time. In this way, the accuracy of the distance determined between the transportation vehicle and the wireless key can be increased. For example, for each data point received from the wireless key, it can be determined by the transportation vehicle-internal authorization device whether the calculated time difference for the respective data point is permissible. By using the plurality of the calculated time differences a statistical analysis of the permissibility can then be carried out.

The disclosed method provides a distance between the transportation vehicle and the wireless key, from which a response signal for granting an access authorization is received, is determined accurately and reliably. A so-called relay attack can therefore be prevented, since an extension of the range between a communication link between the transmit and receive device of the transportation vehicle and the wireless key would cause the reception of the response signal of the wireless key in the transmit and receive device to be delayed. The method enables the distance from the transportation vehicle to the wireless key to be determined irrespective of the design of the key, so that the method can be implemented inexpensively in existing keyless access systems, such as Keyless-Entry or Keyless-Go, and saves on materials.

An exemplary embodiment of the disclosed method provides that the transportation vehicle-internal key processing unit calculates the comparison response by a predefined sequence of computational operations and generates the comparison response signal with the calculated comparison response. In total, to calculate the comparison response and to generate the comparison response signal, the transportation vehicle-internal key processing unit requires a calculation time that corresponds to a calculation time for calculating and generating the response signal by a wireless key. For example, the transportation vehicle-internal key processing unit has a computer program and/or a software application which performs the calculation of the comparison response. The computer program can be configured such that it executes a program and/or a software application to calculate the comparison response with a timing which is identical to a timing of a computer program and/or software of a wireless key. This does not require that the computational operations performed in the transportation vehicle-internal key processing unit match the computational operations performed by the wireless key. All that is necessary is that the program of the key processing unit has a temporally identical behavior to a program of the wireless key. This results in the benefit that the computational operations performed by the key processing unit can be designed in a simple way, which means the effort required to create the key processing unit can be kept to a minimum.

A further exemplary embodiment of the disclosed method provides that the transportation vehicle-internal key processing unit is designed identically to a processing unit of the wireless key for calculating and generating the response signal. In other words the predefined sequence of computational operations, by which the transportation vehicle-internal key processing unit calculates the comparison response and generates the comparison response signal, is identical to a sequence of computational operations which is performed by the wireless key to calculate and generate the response signal. The respective computation operations of the key processing unit and the wireless key are also identical to each other. In other words, the same computer program and/or the same hardware which the wireless key uses to generate and calculate the response signal can be installed in the transportation vehicle-internal key processing unit and used for calculating and generating the comparison response signal. Therefore, the same already available software can be used both transportation vehicle-internally as well as by the wireless key, which means the development of additional software is eliminated.

Optionally, by the time difference which is continuously determined by the plurality of time measuring devices, it is also possible to determine to what extent the time difference changes over a particular period of time. If, for example, the time difference is becoming progressively smaller, this would suggest that the wireless key is approaching the transportation vehicle. A further or alternative request condition is satisfied if the continuously determined time difference is growing progressively smaller. The transportation vehicle-internal authorization device thus only grants access to the transportation vehicle if at least one of the calculated time differences falls below a predetermined threshold value and if these also have progressively lower values. This means that, for example, a predecessor value of the calculated time difference is greater than a successor value of the calculated time difference. This test increases the probability that the wireless key actually is located in the immediate vicinity of the transportation vehicle and is not being misused for a relay attack.

A further exemplary embodiment of the disclosed method provides that the comparison response signal is saved into an output memory and that the response signal received by the transmit and receive device is saved into a transfer memory. A content of the two memories, i.e., the output memory and the transfer memory, is compared by a parallel digital comparator. The memory contents are checked for identity, for example, by comparing each bit position of the one memory with the corresponding position of the other memory. A logic can then output a message, for example, if the two memories have identical memory contents. In regard to the identical memory contents, it is possible only to check the data points that are categorized as predictable. At least one of the memories can be designed, for example, as an arithmetic register. This provides the benefit that the speed of testing of the particular memory contents is fast.

A further exemplary embodiment of the disclosed method provides that the key processing unit generates the comparison response signal using a specific clock frequency. In known manner a wireless key also generates the response signal in response to the request signal with a specific clock frequency. In accordance with this disclosed embodiment, a phase-locked loop controls the clock frequency of the transportation vehicle-internal key processing unit in such a way that the clock frequency is synchronized to the clock frequency of the wireless key. This produces the benefit that the time difference, which the transportation vehicle-internal authorization device determines to decide on an access authorization to the transportation vehicle, is determined precisely.

For this purpose the phase-locked loop may be designed as an analog phase-locked loop or as a digital phase-locked loop. The analog phase-locked loop offers the benefit that it creates the synchronization of the clock frequency of the transportation vehicle-internal key processing unit to the clock frequency of the wireless key rapidly. The digital phase-locked loop proves to be beneficial in that it can be easily integrated into the key processing unit.

The disclosed authorization device for a transportation vehicle has a transportation vehicle-internal authorization device, which is configured to generate a request signal depending on a predefined trigger event and to forward the request signal to a transmit and receive device of the transportation vehicle. The transportation vehicle-internal authorization device is furthermore configured, on receiving a response signal of a wireless key, to check the response signal received for at least one request condition, and depending on the satisfaction of the at least one request condition, to grant the access authorization to the transportation vehicle. The authorization device for the transportation vehicle also has a transmit and receive device, which is configured to emit the request signal into an environment of the transportation vehicle on receipt of the request signal. The transmit and receive device is configured, upon receipt of the response signal from the wireless key, to forward the received response signal to the transportation vehicle-internal authorization device.

The authorization device comprises a transportation vehicle-internal key processing unit, which is configured to calculate a comparison response upon receipt of a request signal and to generate a comparison response signal with the calculated comparison response and forward it to the transportation vehicle-internal authorization device. The transportation vehicle-internal authorization device is also configured to forward the request signal to a transportation vehicle-internal key processing unit at the same time as it forwards the request signal to the transmit and receive device. The transportation vehicle-internal authorization is further configured to determine a time difference between a time of receipt of the response signal received by the transmit and receive device and a time of receipt of the comparison response signal forwarded by the transportation vehicle-internal key processing unit. The at least one request condition is satisfied if the time difference determined by the transportation vehicle-internal authorization device falls below a predefined threshold value.

The benefits and extensions described above in the context of the disclosed method for determining an access authorization to a transportation vehicle apply mutatis mutandis to the disclosed authorization system for a transportation vehicle.

The example described in the following relates to a disclosed embodiment. In the exemplary embodiment, the components of the embodiment described represent individual features of the disclosure to be considered independently of each other, which also extend the disclosure independently of each other and thus are also to be regarded, either individually or in a combination other than the one shown, as an integral part of the disclosure. Furthermore, the embodiment described can also be extended to include other features of the disclosure already described.

In the figures, functionally equivalent elements are provided with the same reference numerals.

Shown schematically in FIG. 1 are a transportation vehicle 10 and a wireless key 12, wherein the transportation vehicle 10 and the wireless key 12 can communicate via a communication link. By a so-called "challenge and response" communication, which takes place via this communication link, the transportation vehicle 10 can be locked and/or unlocked, and/or an engine of the transportation vehicle 10 can be started.

Figure 2:
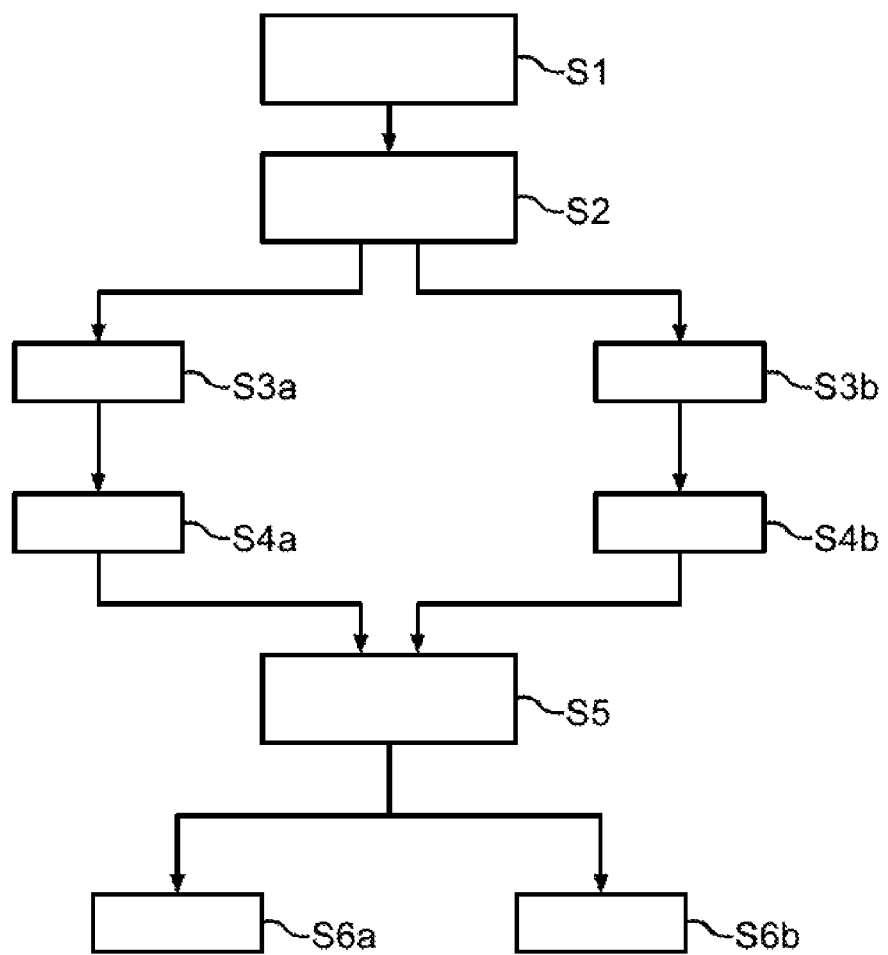
FIG. 2 shows a diagram which elucidates the method for determining an access authorization to a transportation vehicle.

By a diagram, FIG. 2 shows schematically the method operations that a method for determining an access authorization to the transportation vehicle 10 comprises. In the following, the method operations are discussed in conjunction with FIG. 1.

The transportation vehicle 10 has an authorization system, which comprises the following components: a transportation vehicle-internal authorization device 14, a transmit and receive device 16 and a transportation vehicle-internal key processing unit 18. In a first method operation at S1 a trigger signal is registered by the transportation vehicle-internal authorization device 14. For example, the trigger signal is generated when a proximity sensor of the transportation vehicle 10 identifies an approach of a person and/or the wireless key 12. In addition, the trigger signal can be generated when a certain button on a door handle and/or a tailgate of the transportation vehicle 10 is actuated. If the transportation vehicle-internal authorization device 14 registers the trigger signal, the transportation vehicle-internal authorization device 14 generates a request signal 20 in a second method operation at S2.

After generating the request signal 20, the transportation vehicle-internal authorization device 14 forwards the request signal 20 to the transmit and receive device 16 (method operation at S3a) as well as to the transportation vehicle-internal key processing unit 18 (operation at S3b). The transmit and receive device 16 can comprise a so-called transmitter and a so-called transponder, so that the transmit and receive device 16 is designed to emit the request signal 20 via the transmitter into an environment of the transportation vehicle and to receive a possible response signal 22 via the transponder (method operation at S4a). The transmit and receive device 16 is therefore designed to establish a communication link to a wireless key 12. In known manner, the wireless key 12 has an internal processing unit, which is designed to decrypt the request signal 20 of the transportation vehicle-internal authorization device 14 of the transportation vehicle 10 and to send a corresponding response, such as a response signal 22, back to the transportation vehicle 10 via the communication link. If the transmit and receive device 16 receives the response signal 22 of the wireless key 12, the transmit and receive device 16 forwards the response signal 22 to the transportation vehicle-internal authorization device 14.

In parallel with the communication and/or with the exchange of the request signal 20 and the response signal 22 between the transmit and receive device 16 and the wireless key 12, the transportation vehicle-internal key processing unit 18 calculates a comparison response and generates a comparison response signal 24 (method operation at S4b). In doing so, the key processing unit 18 can have a program code which is identical to a program code of the processing unit of the wireless key 12, by which the wireless key 12 determines the response to the request signal 20 and generates the response signal 22. Therefore, this possible response of the wireless key is also determined transportation vehicle-internally by the key processing unit 18 by an identical program code. Alternatively, the program code of the key processing unit 18 can be purely a simulation of the program code of the wireless key 12. The comparison response signal 24 is also forwarded by the key processing unit 18 to the transportation vehicle-internal authorization device 14 in the same way as the response signal 22. In doing so, the respective times of receipt of the response signal 22 and a receipt of the comparison response signal 24 can be different. Since the request signal 20 and the response signal 22 of the wireless key 12 must both be modulated and demodulated in a known manner by the transportation vehicle-side transmit and receive device 16 and by the wireless key 12, this results in an additional time delay which does not need to take place in the transportation vehicle-internal communication between the authorization device 14 and the key processing unit 18. In addition, a further delay is produced by a propagation time of the communication between the transmit and receive device 16 and the wireless key 12, which results from a distance d between the transmit and receive device 16 and the wireless key 12.

After receipt of the comparison response signal 24 and after receipt of the response signal 22 of the wireless key 12, the transportation vehicle-internal authorization device 14 determines a time difference between these two reception times in a fifth method operation at S5. A prerequisite for a correct comparator of these two actual reception times is that a synchronization of a clock frequency of the transportation vehicle-internal key processing unit 18 with a clock frequency of the wireless key 12 has previously taken place. A temporal sequence can then be summarized as follows:

At a time t(0) the transportation vehicle-internal authorization device 14 transfers the request signal 20 to the transmit and receive device 16 and to the transportation vehicle-internal key processing unit 18 at the same time. A signal propagation time via the communication link between the transmit and receive device 16 and the wireless key 12 is designated as t(d). A duration of the modulation and demodulation of a signal (request signal 20 and/or response signal 22) is designated as Kmd and can be a known constant parameter of the transportation vehicle-internal authorization device 14.

At time t(0)+t(d)+Kmd the request signal 20 is then received by the wireless key 12. A computing time which is needed to calculate the response signal 22 is designated as t(P). This computing time is identical to the time that the transportation vehicle-internal key processing unit 18 needs to determine the comparison response signal 24.

At a time t(0)+t(P) the transportation vehicle-internal key processing unit 18 then delivers the comparison response signal 24 to the transportation vehicle-internal authorization device 14. At this point the transportation vehicle-internal authorization device 14 starts a time measurement.

At a time t(0)+t(d)+t(P)+Kmd+Kmd the wireless key 12 emits the response signal 22.

At time t(0)+2t(d)+t(P)+2Kmd the transportation vehicle-internal authorization device 14 receives the transmitted response signal 22 of the wireless key 12. The transportation vehicle-internal authorization device 14 then stops the time measurement.

The time difference t(measured) measured between the start and stop time of the time measurement by the transportation vehicle-internal authorization device 14 is then given by:

$$t(measured)=t(0)+2t(d)+t(P)+2Kmd-[t(0)+t(P)]=2t(d)+2Kmd$$

The time difference t(measured) measured by the transportation vehicle-internal authorization device 14 thus consists of twice the signal propagation time of the communication between the transmit and receive device 16 and the wireless key 12, plus a constant. The constant Kmd is composed of a transportation vehicle-side modulation delay time of the request signal 20, a demodulation delay time of the request signal 20 required by the wireless key 12, a modulation delay time of the response signal 22 required by the wireless key 12, and a transportation vehicle-side demodulation delay time of the response signal 22. The modulation and demodulation delay times are constant and known to the transportation vehicle-internal authorization device 14. The time difference t(measured) determined by the transportation vehicle-internal authorization device 14 is thus proportional to the distance d between the transportation vehicle 10 and the wireless key 12.

To grant access to the transportation vehicle 10 only when the wireless key 12 is located sufficiently near to the transportation vehicle 10, the transportation vehicle-internal authorization device 14 checks the determined time difference t(measured) against a request criterion. This states that access to the transportation vehicle is granted only when the distance d between the transportation vehicle 10 and the wireless key 10 is less than 5 meters, for example. If this is the case, the transportation vehicle-internal authorization device 14 will then unlock the transportation vehicle 10 (method operation at S6a). If this is not the case however, the access to the transportation vehicle 10 is denied by the transportation vehicle-internal authorization device 14 (method operation at S6b). In addition or alternatively, in the method operation at S6a starting an engine of the transportation vehicle 10 is approved by the transportation vehicle-internal authorization device 14.

Additional features of the method for determining the access authorization to the transportation vehicle 10 and additional features of the authorization system are listed in the following. The transportation vehicle-internal key processing unit 18 is referred to hereafter as the master station and the wireless key 12 as the slave station.

Features:

1a. The master station contains the processing unit of the slave station.

1b. The master station includes a simulation of the slave station.

2a. The slave processing unit on the master station and the processing unit of the slave station work with identical code.

2b. The simulation of the slave processing unit on the master station and the processing unit of the slave station work with identical timing.

3. The slave processing unit on the master station has as its output an output register, which is designed as a parallel digital comparator.

4. Expected demodulation values are sent to the output register.

5. The demodulation unit of the transmit and receive device 16 has as its output a transfer register, which is designed as a parallel digital comparator.

6. The code of the slave processing unit on the master station is monitored, non-predictable results are identified and indexed in the output register.

7. The results (responses) of the slave processing unit on the master station are compared with the received responses of the processing unit of the slave station if the comparison response in the output register has not been indexed as not predictable.

8. With the transfer of a non-indexed response of the slave processing unit on the master station to the output register, a time measurement device is started.

9. A positive comparison of the comparators (output register with transfer register) stops the time measurement device.

10. The delay between the responses of the slave processing unit on the master station and the responses received from the processing unit of the slave station in the transfer register is evaluated.

11. The delay values (D f(d)) (distance values) are compared with a defined permissible distance field (E f(d)) and evaluated as 'permissible' or 'impermissible'.

12. The permissible distance field (E f(d)) can be adjusted to the user distance profile (N f(d)) within meaningful limits.

13. The time measurement device is not synchronized with the carrier (clock) frequency.

14. The time measurement device is a cascade counter device, the first element of which is fed by a delay chain (D).

15. The delay chain (D) consists of min. $2^{\wedge}n(8)$ elements.

16. A delay stage delay (d(n)) is <50 ps

17. The first counter device(s) of the cascade is (are) designed as synchronous counters 18. The counters can be stopped synchronously.

19. The counting registers can be retrieved in parallel.

20. The delay chain(D) can be stopped synchronously with the counters.

21. The status of delay chain(D) can be retrieved.

22. The status of the delay chain(D) is converted into a binary value.

23. The clock frequency of the processing units is derived from the carrier frequency of the communication path.

24. For the synchronization of the clock frequency with the carrier frequency, an analog phase-locked loop device (PLL) is used.

25. For the synchronization of the clock frequency with the carrier frequency, a digital phase-locked loop device (PLL) is used.

26. The phase-locked loop is designed in such a way that it follows the carrier frequency with or without a defined phase shift.

27. The phase-locked loop is designed to directly indicate as soon as no phase error any longer occurs, i.e., the phase-locked loop device is 'logged in'.

28. A confirmed synchronization is used as a prerequisite for a distance measurement with increased accuracy.

29. A confirmed synchronization is not a prerequisite for a distance measurement, the delay determination in itself represents a measure of the distance measurement.

Overall, the example shows how a distance measurement between a transportation vehicle and a wireless key can be implemented by the disclosed embodiments to prevent, for example, a possible relay attack.

LIST OF REFERENCE NUMERALS 10 transportation vehicle
12 wireless key
14 transportation vehicle-internal authorization device
16 transmit and receive device
18 transportation vehicle-internal key processing unit
20 request signal
22 response signal
24 comparison response signal
d distance

The invention claimed is:

1. A method for determining an access authorization to a transportation vehicle, the method comprising:

generating and forwarding, by a transportation vehicle-internal authorization device, a request signal to a transmit and receive device of the transportation vehicle;

emitting, by the transmit and receive device of the transportation vehicle, the request signal into an environment of the transportation vehicle depending on a predefined triggering event;

checking, by the transportation vehicle-internal authorization device, the response signal received for at least one request condition;

granting access authorization to the transportation vehicle depending on satisfaction of the at least one request condition and in response to receipt of a response signal of a wireless key by the transmit and receive device;

forwarding, by the transportation vehicle-internal authorization device, the request signal to a transportation vehicle-internal key processing unit at the same time as forwarding the request signal to the transmit and receive device;

calculating, by the transportation vehicle-internal key processing unit, a comparison response;

generating, by the transportation vehicle-internal key processing unit, a comparison response signal with the calculated comparison response; and forwarding, by the transportation vehicle-internal key processing unit, the comparison response signal to the transportation vehicle-internal authorization device in response to receipt of the request signal;

determining, by the transportation vehicle-internal authorization device, a time difference between a time of receipt of the response signal received by the transmit and receive device and a time of receipt of the comparison response signal forwarded by the transportation vehicle-internal key processing unit, wherein the at least one request condition is satisfied in response to the calculated time difference being below a predetermined threshold value; and assembling the comparison response signal and the response signal from the wireless key based on a plurality of data points, wherein each data point of the comparison response signal is categorized as predictable or unpredictable, and the transportation vehicle-internal authorization device compares a respective data point of the comparison response signal with a data point of the response signal of the wireless key in response to the respective data item being categorized as predictable, wherein the transportation vehicle-internal authorization device continuously calculates the time difference using a plurality of time measuring devices, wherein a time measuring device from the plurality of time measuring devices starts a time counter in response to a data point from the comparison response signal being categorized as predictable is received by the transportation vehicle-internal authorization device, and stops the time counter of the respective time measurement device in response to the result of the comparison of the data point from the comparison response signal categorized as predictable with a data point of the response signal of the wireless key shows that the two data points agree with each other.

2. The method of claim 1, wherein the transportation vehicle-internal key processing unit calculates the comparison response and generates the comparison response signal by a predetermined sequence of calculation operations, wherein the transportation vehicle-internal key processing unit requires a total calculation time identical to a calculation time required to calculate and generate the response signal by the wireless key to calculate the comparison response and to generate the comparison response signal.

3. The method of claim 1, wherein the transportation vehicle-internal key processing unit is identical to a processing unit of the wireless key for calculating and generating the response signal.

4. The method of claim 1, wherein the at least one request condition is satisfied in response to the continuously determined time difference becoming continuously smaller.

5. The method of claim 1, wherein the comparison response signal is saved to an output memory and the response signal received by the transmit and receive device is saved to a transfer memory, wherein the output memory and the transfer memory are compared with each other by a parallel digital comparator.

6. The method of claim 1, wherein a phase-locked loop regulates a clock frequency of the transportation vehicle-internal key processing unit so the clock frequency of the transportation vehicle-internal key processing unit runs synchronously with a clock frequency of the wireless key.

7. The method of claim 6, wherein the phase-locked loop is an analog phase-locked loop or a digital phase-locked loop.

8. An authorization system for a transportation vehicle, the authorization system comprising:
a transportation vehicle-internal authorization device configured to generate a request signal depending on a predefined trigger signal and to forward the request signal to a transmit and receive device of the transportation vehicle, wherein the transportation vehicle-internal authorization device checks the received response signal for at least one request condition and, depending on satisfaction of the at least one request condition, grants access authorization to the transportation vehicle on receiving a response signal of a wireless key,
wherein the transmit and receive device emits the forwarded request signal into an environment of the transportation vehicle and directs the received response signal to the transportation vehicle-internal authorization device upon receipt of the response signal from the wireless key,
wherein the authorization device comprises a transportation vehicle-internal key processing unit to calculate a comparison response upon receipt of a request signal and to generate a comparison response signal with the calculated comparison response and to forward it to the transportation vehicle-internal authorization device,
wherein the transportation vehicle-internal authorization device forwards the request signal to a transportation vehicle-internal key processing unit at the same time as forwarding the request signal to the transmit and receive device, wherein the transportation vehicle-internal authorization device determines a time difference between a time of receipt of the response signal received by the transmit and receive device and a time of receipt of the comparison response signal generated by the transportation vehicle-internal key processing unit,
wherein the at least one request condition is satisfied in response to the calculated time difference being below a predetermined threshold value;
wherein the comparison response signal and the response signal from the wireless key are each assembled from a plurality of data points, wherein each data point of the comparison response signal is categorized as predictable or unpredictable, and the transportation vehicle-internal authorization device compares a respective data point of the comparison response signal with a data point of the response signal of the wireless key in response to the respective data point being categorized as predictable, and
wherein the transportation vehicle-internal authorization device continuously calculates the time difference by a plurality of time measuring devices, wherein a time measuring device from the plurality of time measuring devices starts a time counter when a data point from the comparison response signal categorized as predictable is received by the transportation vehicle-internal authorization device, and stops the time counter of the respective time measurement device when the result of the comparison of the data point from the comparison response signal categorized as predictable with a data point of the response signal of the wireless key shows that the two data points agree with each other.

9. The apparatus of claim 8, wherein the transportation vehicle-internal key processing unit calculates the comparison response and generates the comparison response signal by a predetermined sequence of calculation operations, wherein the transportation vehicle-internal key processing unit requires a total calculation time identical to a calculation time required to calculate and generate the response signal by the wireless key to calculate the comparison response and to generate the comparison response signal.

10. The apparatus of claim 8, wherein the transportation vehicle-internal key processing unit is identical to a processing unit of the wireless key for calculating and generating the response signal.

11. The apparatus of claim 8, wherein the at least one request condition is satisfied in response to the continuously determined time difference becoming continuously smaller.

12. The apparatus of claim 8, wherein the comparison response signal is saved to an output memory and the response signal received by the transmit and receive device is saved to a transfer memory, wherein the output memory and the transfer memory are compared with each other by a parallel digital comparator.

13. The apparatus of claim 8, wherein a phase-locked loop regulates a clock frequency of the transportation vehicle-internal key processing unit so the clock frequency of the transportation vehicle-internal key processing unit runs synchronously with a clock frequency of the wireless key.

14. The apparatus of claim 8, wherein the phase-locked loop is an analog phase-locked loop or a digital phase-locked loop.

* * * * *